(12) United States Patent
Brown et al.

(10) Patent No.: US 8,115,531 B1
(45) Date of Patent: Feb. 14, 2012

(54) D FLIP-FLOP HAVING ENHANCED IMMUNITY TO SINGLE-EVENT UPSETS AND METHOD OF OPERATION THEREOF

(75) Inventors: Jeff S. Brown, Fort Collins, CO (US); Miguel A. Vilchis, San Jose, CA (US); Mark F. Turner, Longmont, CO (US)

(73) Assignee: LSI Corporation, Milpitas, CA (US)

( * ) Notice: Subject to any disclaimer, the term of this patent is extended or adjusted under 35 U.S.C. 154(b) by 470 days.

(21) Appl. No.: 12/058,824

(22) Filed: Mar. 31, 2008

(51) Int. Cl.
*H03K 3/289* (2006.01)

(52) U.S. Cl. .......................... 327/202; 327/203; 327/208

(58) Field of Classification Search .......... 327/202–203, 327/205–206, 208, 210–212, 214, 215, 218
See application file for complete search history.

(56) References Cited

U.S. PATENT DOCUMENTS

| | | | | |
|---|---|---|---|---|
| 4,820,939 A | * | 4/1989 | Sowell et al. | 327/203 |
| 6,909,314 B2 | * | 6/2005 | Ahn | 327/202 |
| 2003/0102897 A1 | * | 6/2003 | Hannum et al. | 327/205 |

* cited by examiner

*Primary Examiner* — Long Nguyen

(57) ABSTRACT

A D flip-flop (DFF), a method of operating a DFF, a latch and a library of standard logic elements including standard logic elements corresponding to a DFF and a latch. In one embodiment, the DFF has a data input and a data output and includes: (1) a master stage passgate coupled to the data input, (2) a master stage coupled to the master stage passgate and having a hysteresis inverter with feedback transistors of opposite conductivity, (3) a slave stage passgate coupled to the master stage and (4) a slave stage coupled between the slave stage passgate and the data output and having a hysteresis inverter with feedback transistors of opposite conductivity.

20 Claims, 7 Drawing Sheets

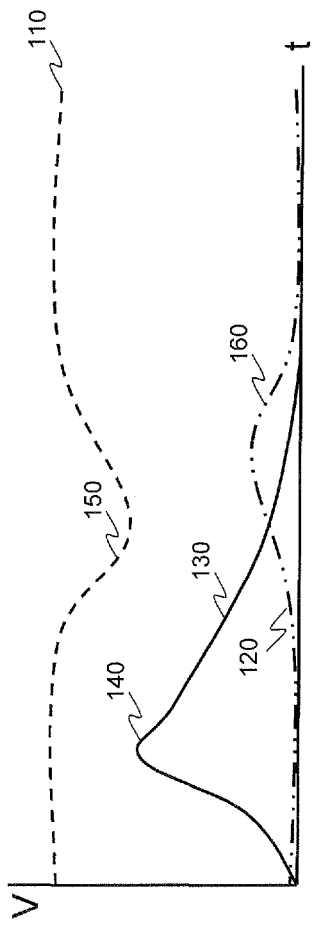
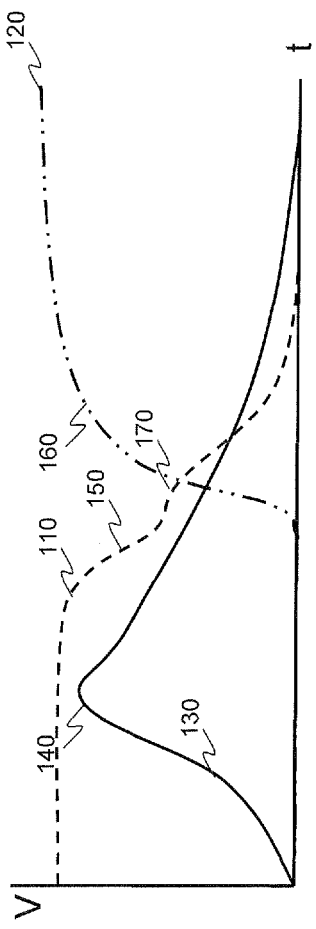
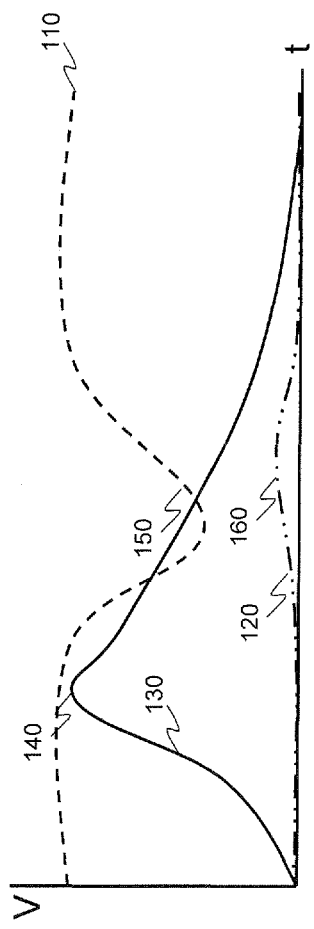
Fig. 1A
Fig. 1B
Fig. 1C

D FLIP-FLOP HAVING ENHANCED IMMUNITY TO SINGLE-EVENT UPSETS AND METHOD OF OPERATION THEREOF

TECHNICAL FIELD

The invention is directed, in general, to bistable multivibrators and, more specifically, to a D flip-flop (DFF) that has an enhanced immunity to single-bit upsets (SBUs) and a method of operating a DFF such that its vulnerability to SBUs is reduced.

BACKGROUND

Background radiation from alpha particles, neutrons and cosmic rays can create momentary upsets (so-called single-event upsets, or SEUs) in data inside an integrated circuit (IC). Some SEUs, called single-event transients (SETs), do not affect bit values. Other, more severe SEUs may affect the value of one or more bits. SEUs that affect the value of one bit are called SBUs. The rate at which SBUs occur affects the IC's soft error rate (SER). SBUs may go unnoticed if the data is changed back to the correct value before it is stored. However, an SBU may cause an error if the upset data is stored or if the upset directly changes the data contained in a storage element. Decreases in feature sizes and operating voltages have caused the SER of standard logic elements in ICs to rise. One of these standard logic elements is a DFF.

As those skilled in the pertinent art are aware, DFFs have a data output, Q, that always assumes the state of a data input, D, when a clock signal provided to the DFF goes high. In other words, until an edge occurs in the clock signal, Q maintains the state D had at the last occurrence of the same edge-type. In this sense, DFFs act as a temporary storage element or delay line. These are basic functions. Consequently, DFFs find wide use in shift registers and other logic circuits. Any vulnerability a DFF may have to SBUs can be of major concern.

Some DFFs are specially designed to function in high radiation environments. They use mitigation schemes such as temporal sampling to provide SBU immunity. Temporal sampling employs multiple (typically three) storage elements for each bit of data and a voting scheme to overrule an SBU-affected storage element. Unfortunately, temporal sampling not only causes DFFs to be significantly larger (stemming from the multiple storage elements required), but also slows down their operation, reducing the performance of any IC using such DFFs.

Most DFFs are not specially designed to function in a high radiation environment. Ordinary DFFs are either sufficiently large or operate at a higher voltage such that the SBU problem is not as pronounced or include no mechanism to address the SBU problem whatsoever and suffer the consequences. Unfortunately, applications in which SBU immunity is not absolutely critical may still have a high cost associated with SBUs. Those applications may benefit from a DFF that has a decreased vulnerability to SBUs without resorting to elaborate mitigation schemes such as temporal sampling. Standard libraries of logic elements including DFFs may also benefit from such an enhanced-immunity DFF. Those applications and standard libraries may further benefit from latches that exhibit an enhanced immunity to SBUs.

SUMMARY

To address the above-discussed deficiencies of the prior art, one aspect of the invention provides a DFF. In one embodiment, the DFF has a data input and a data output and includes: (1) a master stage passgate coupled to the data input, (2) a master stage coupled to the master stage passgate and having a hysteresis inverter with feedback transistors of opposite conductivity, (3) a slave stage passgate coupled to the master stage and (4) a slave stage coupled between the slave stage passgate and the data output and having a hysteresis inverter with feedback transistors of opposite conductivity.

Another aspect of the invention provides a method of operating a DFF having a data input and a data output. In one embodiment, the method includes: (1) receiving a logic state into a master stage passgate coupled to the data input, (2) passing the logic state from the master stage passgate to a master stage coupled to the master stage passgate and having a hysteresis inverter with feedback transistors of opposite conductivity, (3) passing the logic state from the master stage to a slave stage passgate coupled to the master stage and (4) passing the logic state from the slave stage passgate to a slave stage coupled between the slave stage passgate and the data output and having a hysteresis inverter with feedback transistors of opposite conductivity.

Yet another aspect of the invention provides a latch having a data input and a data output. In one embodiment, the latch includes: (1) a passgate coupled to the data input, (2) a hysteresis inverter coupled to the passgate and having feedback transistors of opposite conductivity and (3) a further inverter having an input coupled to an output of the hysteresis inverter and an output coupled to an input of the hysteresis inverter, the data output coupled between the output of the hysteresis inverter and the input of the inverter.

Still another aspect of the invention provides a library of standard logic elements. In one embodiment, the library includes: (1) a standard logic element corresponding to a D flip-flop having a data input and a data output and including: (1a) a master stage passgate coupled to the data input, (1b) a master stage coupled to the master stage pass-gate and having a hysteresis inverter with feedback transistors of opposite conductivity, (1c) a slave stage passgate coupled to the master stage and (1d) a slave stage coupled between the slave stage passgate and the data output and having a hysteresis inverter with feedback transistors of opposite conductivity and (2) a standard logic element corresponding to a latch having a data input and a data output and including: (2a) a pass-gate coupled to the data input, (2b) a hysteresis inverter coupled to the passgate and having feedback transistors of opposite conductivity and (2c) a further inverter having an input coupled to an output of the hysteresis inverter and an output coupled to an input of the hysteresis inverter, the data output coupled between the output of the hysteresis inverter and the input of the inverter.

The foregoing has outlined certain aspects and embodiments of the invention so that those skilled in the pertinent art may better understand the detailed description of the invention that follows. Additional aspects and embodiments will be described hereinafter that form the subject of the claims of the invention. Those skilled in the pertinent art should appreciate that they can readily use the disclosed aspects and embodiments as a basis for designing or modifying other structures for carrying out the same purposes of the invention. Those skilled in the pertinent art should also realize that such equivalent constructions do not depart from the scope of the invention.

BRIEF DESCRIPTION OF THE DRAWINGS

For a more complete understanding of the invention, reference is now made to the following descriptions taken in conjunction with the accompanying drawings, in which:

FIG. 1A is a graph illustrating a charged particle strike on a DFF that is below a critical charge for a conventional DFF;

FIG. 1B is a graph illustrating a charged particle strike on a DFF that is at or above a critical charge for a conventional DFF;

FIG. 10 is a graph illustrating a charged particle strike on a DFF constructed according to the principles of the invention that is of substantially the same charge magnitude as the strike of FIG. 1B but below a higher critical charge for the DFF of FIG. 10;

DETAILED DESCRIPTION OF CERTAIN ASPECTS AND EMBODIMENTS

Figure 2:
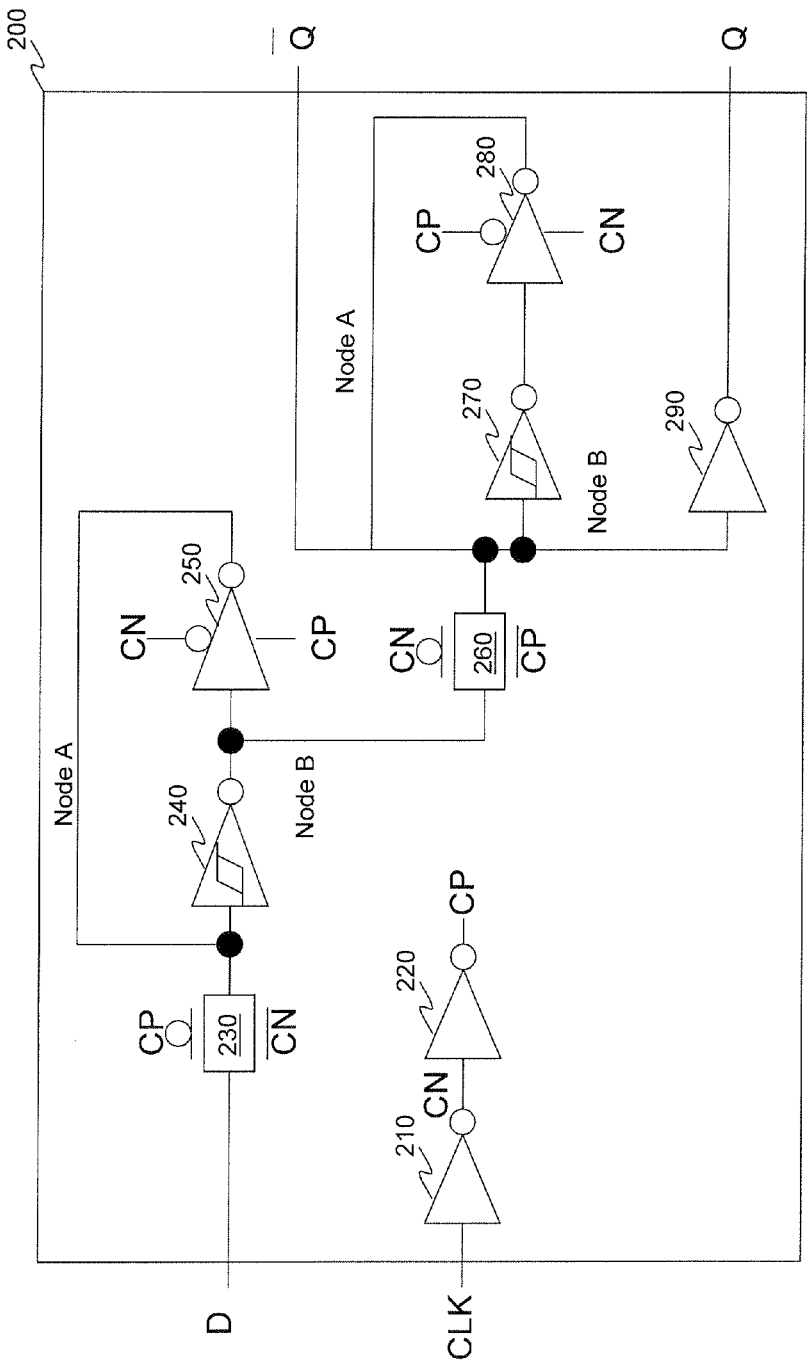
FIG. 2 is a component-level schematic diagram of one embodiment of a DFF having an enhanced immunity to SBUs constructed according to the principles of the invention.

Conventional DFFs are built with transmission gate latches. Each transmission gate latch has a pair of pass-gates that alternately allow the latch to be transparent or latched (in which it stores the value at the end of the last transparent phase). The passgates may be inverter-driven or implemented as tristate buffers, which use series-coupled transistors of opposite conductivity.

When a charged particle strikes the drain of an undriven transistor, the charge that results from the strike is transferred onto the node in the circuit and can cause the voltage to droop from a nominal positive supply voltage (or rise from a nominal negative supply voltage). A charge resulting from a strike that is barely sufficient to cause the latch to have an SBU is called the "critical charge."

FIG. 1A is a graph illustrating a charged particle strike on a DFF that is below a critical charge for a conventional DFF. A first curve 110 represents a voltage of a first node (a "Node A") of a master stage of the DFF. A second curve 120 represents a voltage of a second, complementary node (a "Node B") of the master stage. The first curve 110 has a positive voltage that, in this case, represents a logical "one," and that the second curve 120 has a near-zero voltage that, in this case, represents a logical "zero." Prior to the strike, at the left-hand side of FIG. 1A, the master stage is stable. A curve 130 represents a voltage induced into the master stage by the charged particle strike. The strike causes the voltage of the curve 130 to peak at a level 140. In response, the master stage destabilizes. The voltage of Node A sags at a point 150 of the first curve 110 and propagates to Node B, where the voltage rises at a point 160 of the second curve 120. However, the first and second curves 110, 120 thereafter substantially return to the voltages they had before the strike, the master stage restabilizes, and an SBU is avoided.

The amount of voltage change is dependant on the stored charge already on the node (e.g., Node A), as well as the capacitance of the node and the resistance of the driver actively driving the node. If the voltage change is enough to propagate through the stage and change the state of the latch, an SBU is created.

FIG. 1B is a graph illustrating a charged particle strike on a DFF that is at or above a critical charge for a conventional DFF. Again, before the strike, the first curve 110 has a positive voltage representing a "one," and the second curve 120 has a near-zero voltage representing a "zero." In FIG. 1B, the strike causes the voltage of the curve 130 to peak at a level 140, which exceeds the level 140 of FIG. 1A and also exceeds the critical charge for the master stage. Thus, the voltage of Node A sags at the point 150 of the first curve 110 and propagates to Node B, where the voltage rises at the point 160 of the second curve 120. However, the Node B voltage propagates back to node A. In response, and instead of recovering as it did in FIG. 1A, the first curve 110 collapses at an inflection point 170 toward "zero," and the second curves 120 soars toward "one." The master stage then stabilizes, but the curves 110, 120 have assumed values that are opposite what they should be; an SBU has occurred. Raising the value of the critical charge in the system can improve the immunity of the master stage to SBUs.

Conventional DFFs use latches with simple inverters to store the value. Replacing the standard inverters with inverters that have hysteresis (e.g., Schmitt triggers) raises the value of the critical charge. In other words, a charged particle strike can transfer more charge into the DFF without causing an SBU. The DFF's immunity to SBUs is enhanced, and its SER decreases as a result. Further, the DFF's immunity may be enhanced without incurring large IC area penalties. In one embodiment, modifying an otherwise conventional DFF to increase its immunity incurs only a 15% area penalty, but doubles its critical charge.

FIG. 10 is a graph illustrating a charged particle strike on a DFF constructed according to the principles of the invention. The strike is of substantially the same charge magnitude as the strike of FIG. 1B but below a higher critical charge for the DFF of FIG. 10. The strike causes the voltage of the curve 130 to peak at the level 140, which is substantially the same as the level 140 of FIG. 1B. In response, the master stage destabilizes. The voltage of the first node substantially sags at a point 150 of the first curve 110. In fact, the magnitude of the sag of the first curve 110 exceeds that of the sag of the first curve 110 of FIG. 1A. The sag propagates to Node B. However, the hysteresis of the hysteresis inverter attenuates the magnitude of that propagation. As a result, the voltage of the second node rises only modestly at the point 160. When propagated back to Node A, the sag at Node B is insufficient to cause the voltage of Node A to collapse toward "zero." As a result, the first and second curves 110, 120 thereafter substantially return to the voltages they had before the strike, the master stage restabilizes, and an SBU is avoided.

FIG. 2 is a component-level schematic diagram of one embodiment of a DFF 200 having an enhanced immunity to SBUs constructed according to the principles of the invention. For the purpose of describing FIGS. 2-6, references will be made to a positive supply voltage and a negative supply voltage. Although the invention is not limited to particular type of transistor, the various transistors of FIGS. 2-6 are metal-oxide semiconductor field-effect transistors (MOSFETs), in which case the nominal positive supply voltage commonly referred to as Vdd, and the nominal negative supply voltage is commonly referred to as Vss.

The DFF 200 has a data input D, a clock input CLK, a data output Q and an inverted data output $\overline{Q}$. First and second series-coupled inverters 210, 220 are coupled to CLK and respectively provide a negative clock pulse signal, CN, and a positive clock pulse signal CP. A master stage passgate 230, alternatively known as a transmission gate, is coupled to D. A latch, coupled to the master stage passgate 230, forms a master stage of the DFF 200. The master stage includes a hysteresis inverter 240 and a tristate inverter 250 and has Nodes A and B interposing the hysteresis inverter 240 and the tristate inverter 250. As stated above, the tristate inverter 250 may instead be an inverter-driven pass-gate.

A slave stage passgate 260 is coupled to Node A of the master stage. Another latch, coupled to the slave stage passgate 260, forms a slave stage of the DFF 200. The slave stage includes a hysteresis inverter 270 and a tristate inverter 280 and has Nodes A and B interposing the hysteresis inverter 270 and the tristate inverter 180. As stated above, the tristate inverter 280 may be an inverter-driven passgate instead of a tristate buffer.

An inverter 290 is coupled to Node A of the slave stage and provides Q. In the embodiment of FIG. 2, Q is coupled directly to Node A of the slave stage, though it may be derived by other means.

As FIG. 2 shows, CP and CN drive the master stage passgate 230, master stage tristate inverter 250, slave stage passgate 260 and slave stage tristate inverter 280 to convey a logic state (either a "zero" or a "one") that is initially present at D through the master stage, through the slave stage and out Q and $\overline{Q}$.

More specifically, the master stage and slave stage passgates 230, 260 each contain a p-channel MOSFET (PMOS) transistor and an n-channel MOSFET (NMOS) transistor. The master stage PMOS transistor and slave stage NMOS transistor receive CP, and the master stage NMOS transistor and slave stage PMOS transistor receive CN. When CP is low and CN is high, the master stage passgate 230 passes the logic state present at D, and the tristate inverter 250 places the master stage in a transparent phase, allowing the master stage passgate 230 to pass the logic state present at D to the hysteresis inverter 240. When CP is high and CN is low, the slave stage pass-gate 260 passes the logic state present at Node B of the master stage, and the tristate inverter 280 places the slave stage in a transparent phase, allowing the slave stage passgate 260 to pass the logic state present at Node B of the master stage to the hysteresis inverter 270.

When CP is high and CN is low, the master stage passgate 230 closes, and the tristate inverter 250 places the master stage into a latched, or opaque, state in which the logic state provided to the hysteresis inverter 240 is stored in the master stage. Likewise, when CP is low and CN is high, the slave stage passgate 260 closes, and the tristate inverter 280 places the slave stage into a latched state in which the logic state provided to the hysteresis inverter 270 is stored in the slave stage.

Figure 3:
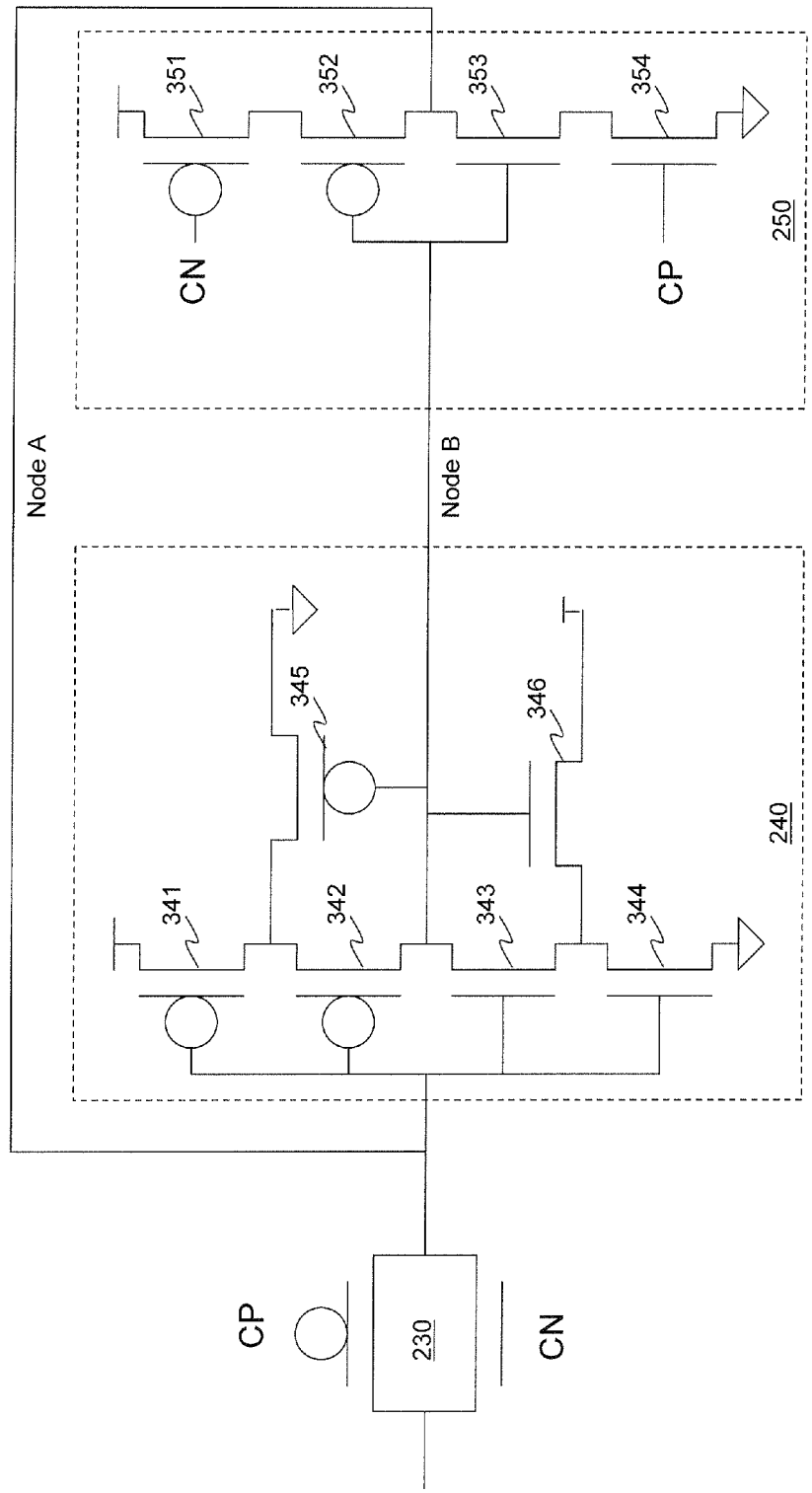
FIG. 3 is a device-level schematic diagram of one embodiment of a master stage of the DFF of FIG. 2.

FIG. 3 is a device-level schematic diagram of one embodiment of the master stage of the OFF 200 of FIG. 2. In FIG. 3, the hysteresis inverter 240 takes the form of a Schmitt trigger containing PMOS and NMOS transistors 341, 342, 343, 344 coupled in series between the positive rail and the negative rail. The hysteresis inverter 240 further has feedback PMOS and NMOS transistors 345, 346. An input to the Schmitt trigger drives the PMOS and NMOS transistors 341, 342, 343, 344, and an output of the Schmitt trigger drives the feedback PMOS and NMOS transistors 345, 346. In the embodiment of FIG. 3, the feedback PMOS transistor 345 is tied to the negative rail, and the feedback NMOS transistor 346 is tied to the positive rail.

Those skilled in the pertinent art are familiar with the general design and operation of Schmitt triggers, though outside of the context of DFFs. As those skilled in the pertinent art understand, a Schmitt trigger exhibits hysteresis, or a delay in a change of its output state relative to a change in its input state.

For example, if the input state of the hysteresis inverter 240 is initially "zero," and a "one" is applied to its input, the PMOS transistors 341, 342 begin to turn off, and the NMOS transistors 343, 344 begin to turn on. Due to the presence of the "one" at the output of the Schmitt trigger, the feedback PMOS transistor 345 is already turned off, so a node between the PMOS transistors 341, 342 is substantially isolated from the negative rail. However, the NMOS transistor 346 is already turned on, which couples a node between the NMOS transistors 343, 344 to the positive rail. The NMOS transistor 346 provides a feedback of positive voltage to the node between the NMOS transistors 343, 344, which impedes a rapid fall of that node toward the voltage of the negative rail. Consequently, the voltage of that node falls slowly until the feedback NMOS transistor 346 to begin to turn off. The turning off of the feedback NMOS transistor 346 removes the positive-rail bias from the node between the NMOS transistors 343, 344.

Likewise, if the input state of the hysteresis inverter 240 is initially "one," and a "zero" is applied to its input, the PMOS transistors 341, 342 begin to turn on, and the NMOS transistors 343, 344 begin to turn off. The feedback PMOS transistor 345 is already turned on, so the node between the PMOS transistors 341, 342 is coupled to the negative rail. The PMOS transistor 345 provides a feedback of negative voltage to the node between the PMOS transistors 341, 342, which impedes a rapid rise of that node toward voltage of the positive rail. Consequently, the voltage of that node rises slowly until the feedback NMOS transistor 346 to begin to turn off. The negative-rail bias is removed from the node between the PMOS transistors 341, 342.

The tristate inverter 250 contains PMOS and NMOS transistors 351, 352, 353, 354 coupled in series between the positive rail and the negative rail. An input to the tristate inverter 250 is coupled to the output of the hysteresis inverter 240 via Node B. An output of the tristate inverter 250 is coupled to the input of the hysteresis inverter 240 via Node A. The input of the tristate inverter 250 drives the PMOS transistor 352 and the NMOS transistor 353. CN drives the PMOS transistor 351, and CP drives the NMOS transistor 354. The output state of the tristate inverter 250 assumes the inverse of its input state when CN is low (and CP is high). Otherwise, the output state is tristated. The output state is fed back via Node A to the input of the hysteresis inverter 240, which inverts the output state and provides it back to the input of the tristate inverter 250 via Node B. This condition holds until the passgate 230 introduces a different state to the input of the hysteresis inverter 240.

Should a charged particle strike occur in a drain of an undriven one of the PMOS and NMOS transistors 341, 342 343, 344, one or more nodes in the hysteresis inverter 240 may begin a rapid rise or fall toward an undesired voltage. Fortunately, the feedback PMOS and NMOS transistors 345, 346 impede that rapid rise or fall, substantially increasing the critical charge (the charge required to change the output state of the master latch).

Figure 4:
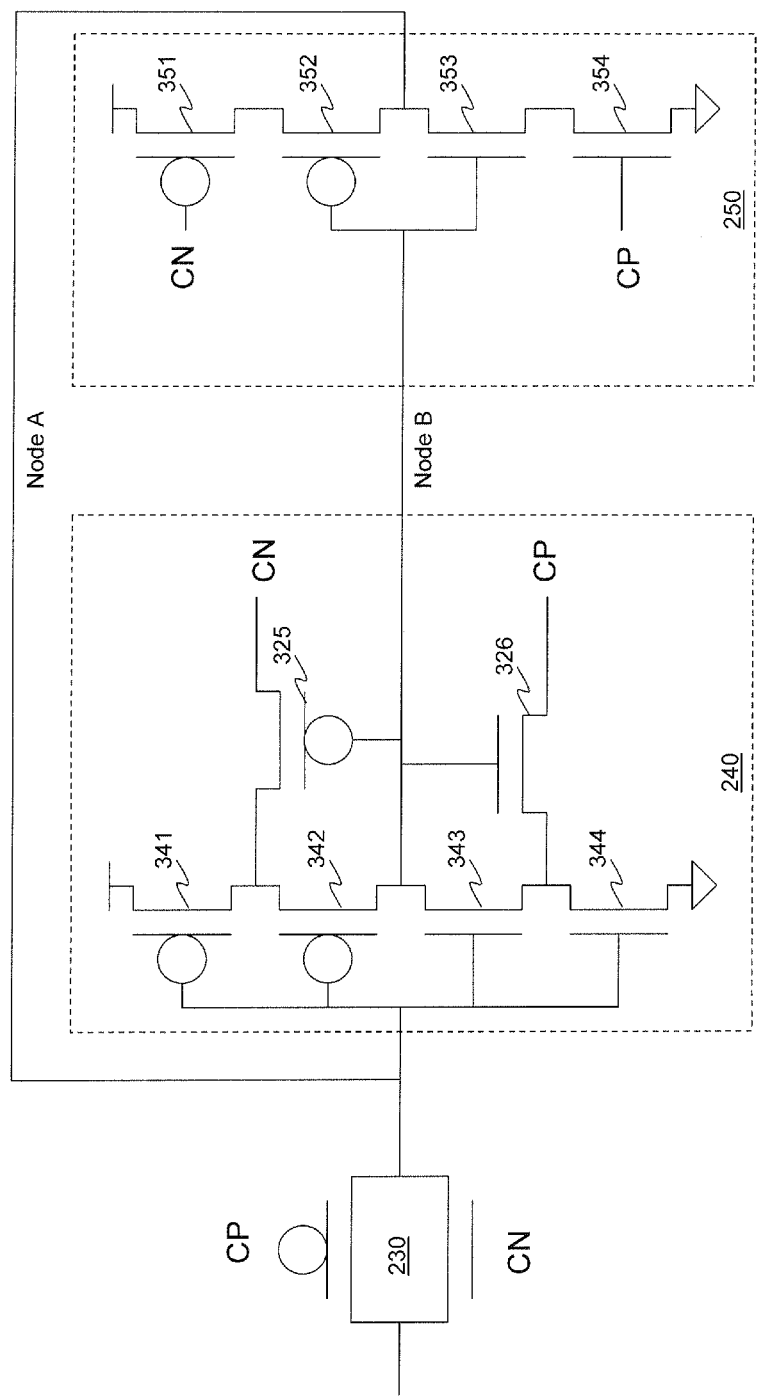
FIG. 4 is a device-level schematic diagram of another embodiment of a master stage of the DFF of FIG. 2.

As stated above, the embodiment of FIG. 3 ties the feedback PMOS transistor 345 to the negative rail and the feedback NMOS transistor 346 to the positive rail. The hysteresis that results is beneficial for reducing SBUs. However, since the feedback PMOS and NMOS transistors 345, 346 always provide hysteresis, they also impede intentional changes occurring when the master stage is in a transparent phase. Accordingly, FIG. 4 is a device-level schematic diagram of another embodiment of a master stage of the DFF of FIG. 2 in which the feedback PMOS transistor 345 is tied to CN, and the feedback NMOS transistor 346 is tied to CP. In the embodiment of FIG. 4, the feedback PMOS and NMOS transistors 345, 346 only provide hysteresis when CN is low (and CP is high). When CN is high (and CP is low) the feedback PMOS and NMOS transistors 345, 346 actually assist the PMOS transistors 341, 344 respectively. Though some additional power is consumed using CP and CN to provide hysteresis, restricting hysteresis in the master stage to its transparent phase is a worthwhile tradeoff.

Figure 5:
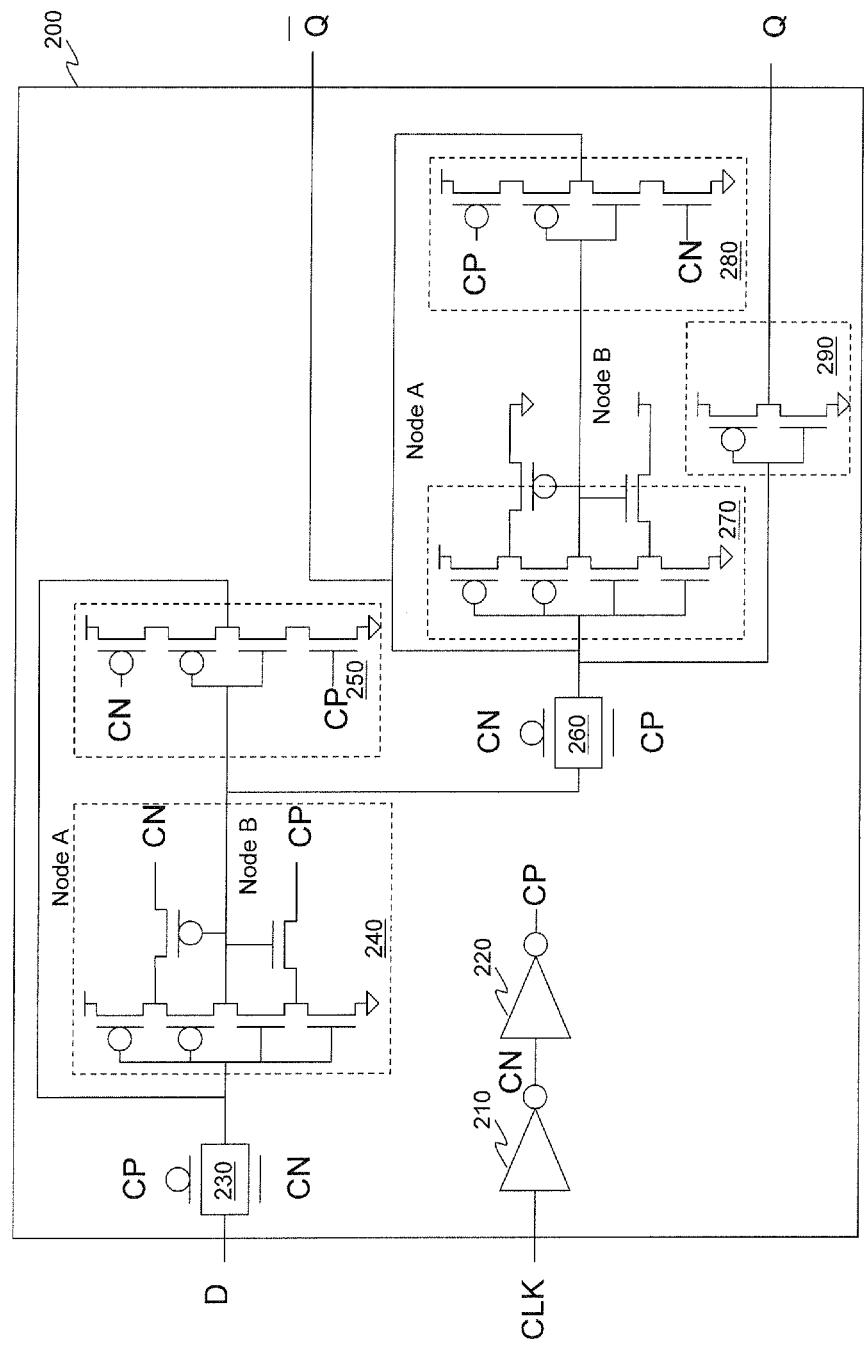
FIG. 5 is a device-level schematic diagram of one embodiment of the DFF of FIG. 2.

FIG. 5 is a device-level schematic diagram of one embodiment of the DFF of FIG. 2. FIG. 5 employs the master stage of FIG. 4, and provides greater detail concerning devices in the slave stage. FIG. 5 illustrates an embodiment in which the hysteresis inverter 270 is illustrated as being a Schmitt trigger. As was the hysteresis inverter 240 of FIG. 3, the hysteresis inverter 270 of FIG. 5 ties the feedback PMOS transistor 345 to the negative rail and the feedback NMOS transistor 346 to the positive rail. The operation of the hysteresis inverter 270 of FIG. 5 is the same as that of the hysteresis inverter 240 of FIG. 3. Just as the hysteresis inverter 240 of FIG. 3 reduces SBUs in the master stage, the hysteresis inverter 270 of FIG. 5 reduces SBUs in the slave stage.

Figure 6:
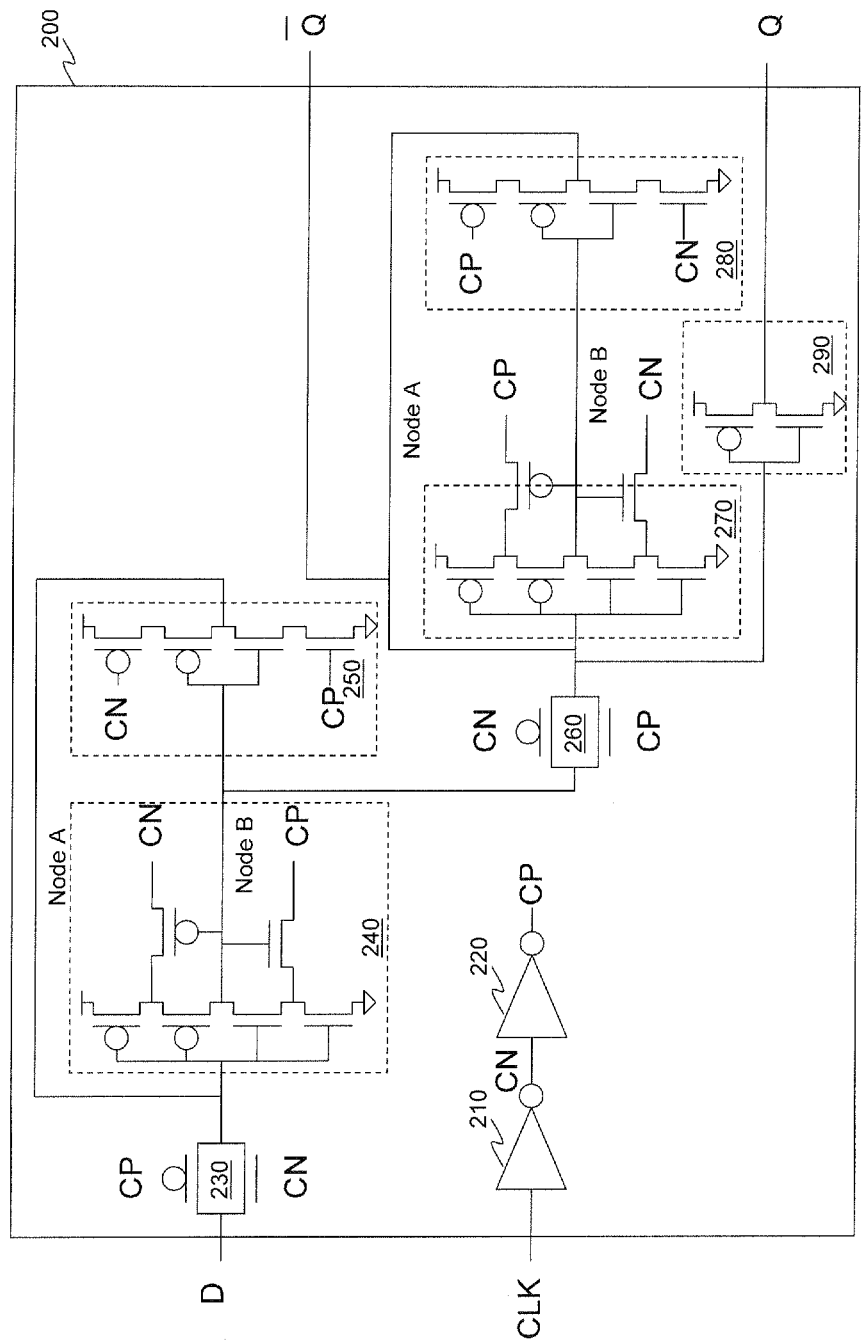
FIG. 6 is a device-level schematic diagram of another embodiment of the DFF of FIG. 2.

FIG. 6 is a device-level schematic diagram of another embodiment of the DFF of FIG. 2. FIG. 6 provides a hysteresis inverter 270 that is like the hysteresis inverter 240 of FIG. 4, in that its feedback PMOS and NMOS transistors are tied to clock signals. More specifically, its feedback PMOS transistor (not referenced) is tied to CP, and its feedback NMOS transistor (also not referenced) is tied to CN. Unlike the hysteresis inverter 270 of FIG. 5, which always provides hysteresis and impedes intentional changes occurring when the slave stage is in a transparent phase, the feedback PMOS and NMOS transistors in the hysteresis inverter 270 of FIG. 5 only provide hysteresis when CP is low (and CN is high). Some additional power is consumed using CP and CN to provide hysteresis. However, since the slave stage merely maintains the value of Q and $\overline{Q}$ and does not lie in the datapath between D and Q/$\overline{Q}$, restricting hysteresis in the slave stage to its transparent phase is not typically a worthwhile tradeoff.

Figure 7:
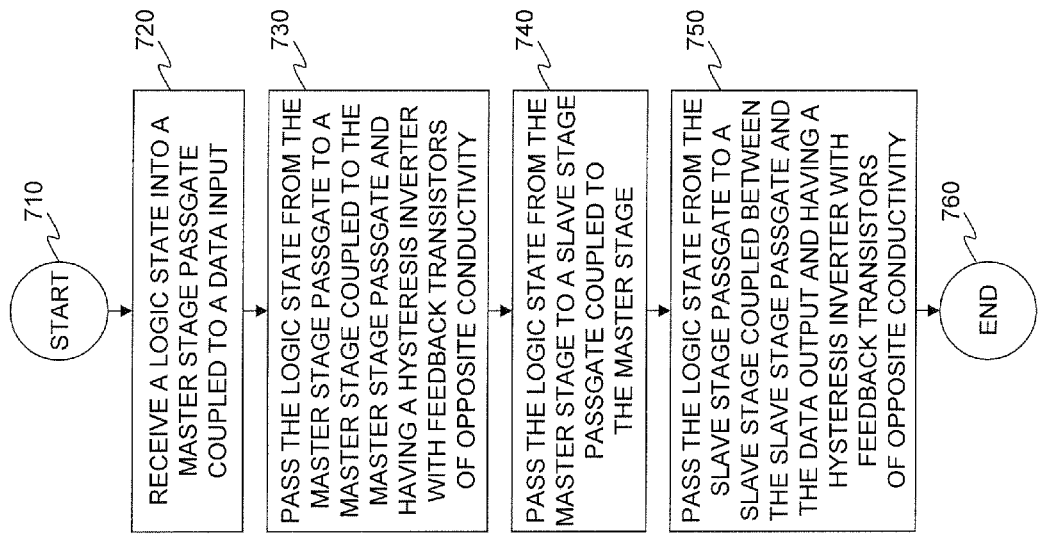
FIG. 7 is a flow diagram of one embodiment of a method of operating a DFF such that its vulnerability to SBUs is reduced.

FIG. 7 is a flow diagram of one embodiment of a method of operating a DFF such that its vulnerability to SBUs is reduced. The method begins in a start step 710. In a step 720, a logic state is received into a master stage passgate coupled to the data input. In a step 730, the logic state is passed from the master stage passgate to a master stage coupled to the master stage passgate and having a hysteresis inverter with feedback transistors of opposite conductivity. In a step 740, the logic state is passed from the master stage to a slave stage passgate coupled to the master stage. In a step 750, the logic state is passed from the slave stage passgate to a slave stage coupled between the slave stage passgate and the data output and having a hysteresis inverter with feedback transistors of opposite conductivity. The method ends in an end step 760.

In addition to the DFF embodiments described above, the hysteresis inverter may be employed along with a tristate inverter or other type of passgate in a standard latch. In such case, the latch would be structured like either the master stage or the slave stage of the DFF described herein. In other words, the latch would have an input coupled to the input of the hysteresis inverter, an input of the tristate inverter coupled via a Node B to an output of the hysteresis inverter, an output coupled to Node B, and an output of the tristate inverter coupled via a Node A to the input of the hysteresis inverter (the input of the latch therefore also being coupled to Node A). One embodiment of a method of operating a latch carried out according to the principles of the invention has steps analogous to those of the method of FIG. 7.

Further, the DFF or the latch may be incorporated into a library of standard logic elements that may be employed to design ICs and masks for fabrication of ICs that contain many, perhaps thousands or even millions of DFFs and latches constructed according to the principles of the invention. The ICs may as a result exhibit a substantially enhanced immunity to SBUs and a decrease in SER as a result of application of the disclosure herein.

Those skilled in the art to which the invention relates will appreciate that other and further additions, deletions, substitutions and modifications may be made to the described embodiments without departing from the scope of the invention.

What is claimed is:

1. A D flip-flop having a data input and a data output and comprising:
   a master stage passgate coupled to said data input;
   a master stage coupled to said master stage passgate and having a hysteresis inverter with feedback transistors of opposite conductivity, wherein hysteresis in said master stage is restricted to a transparent phase of said master stage;
   a slave stage passgate coupled to said master stage; and
   a slave stage coupled between said slave stage passgate and said data output and having a hysteresis inverter with feedback transistors of opposite conductivity.

2. The D flip-flop as recited in claim 1 wherein said feedback transistors of said hysteresis inverter of said master stage are respectively tied to a positive supply voltage and a negative supply voltage.

3. The D flip-flop as recited in claim 1 wherein a first one of said feedback transistors of said hysteresis inverter of said master stage is tied to a positive clock signal and a second one of said feedback transistors of said hysteresis inverter of said master stage is tied to a negative clock signal.

4. The D flip-flop as recited in claim 1 wherein said feedback transistors of said hysteresis inverter of said slave stage are respectively tied to a positive supply voltage and a negative supply voltage.

5. The D flip-flop as recited in claim 1 wherein said feedback transistors of said hysteresis inverter of said slave stage are tied to clock signals.

6. The D flip-flop as recited in claim 1 wherein, said feedback transistors of said hysteresis inverter of said master stage and said feedback transistors of said hysteresis inverter of said slave stage are PMOS and NMOS transistors.

7. The D flip-flop as recited in claim 1 wherein said master stage further has a tristate inverter having an input coupled to an output of said hysteresis inverter of said master stage and an output coupled to an input of said hysteresis inverter of said master stage and said slave stage further has a tristate inverter having an input coupled to an output of said hysteresis inverter of said slave stage and an output coupled to an input of said hysteresis inverter of said slave stage.

8. The D flip-flop as recited in claim 1 wherein said feedback transistors of said hysteresis inverter of said master stage are coupled to a node between two series-coupled PMOS transistors and two series-coupled NMOS transistors of said hysteresis inverter of said master stage.

9. The D flip-flop as recited in claim 1 wherein said feedback transistors of said hysteresis inverter of said slave stage are coupled to a node between two series-coupled PMOS transistors and two series-coupled NMOS transistors of said hysteresis inverter of said slave stage.

10. The D flip-flop as recited in claim 1 wherein said feedback transistors of said hysteresis inverter of said master stage are coupled to respective nodes between PMOS transistors and NMOS transistors of said hysteresis inverter of said master stage.

11. A method of operating a D flip-flop having a data input and a data output and comprising:
   receiving a logic state into a master stage passgate coupled to said data input;
   passing said logic state from said master stage passgate to a master stage coupled to said master stage passgate and having a hysteresis inverter with feedback transistors of opposite conductivity, wherein hysteresis in said master stage is restricted to a transparent phase of said master stage;
   passing said logic state from said master stage to a slave stage passgate coupled to said master stage; and
   passing said logic state from said slave stage passgate to a slave stage coupled between said slave stage passgate and said data output and having a hysteresis inverter with feedback transistors of opposite conductivity.

12. The method as recited in claim 11 wherein said feedback transistors of said hysteresis inverter of said master stage are respectively tied to a positive supply voltage and a negative supply voltage.

13. The method as recited in claim 11 wherein a first one of said feedback transistors of said hysteresis inverter of said master stage is tied to a positive clock signal and a second one of said feedback transistors of said hysteresis inverter of said master stage is tied to a negative clock signal.

14. The method as recited in claim 11 wherein said feedback transistors of said hysteresis inverter of said slave stage are respectively tied to a positive supply voltage and a negative supply voltage.

15. The method as recited in claim 11 wherein said feedback transistors of said hysteresis inverter of said slave stage are tied to clock signals.

16. A latch having a data input and a data output and comprising:
   a passgate coupled to said data input;
   a hysteresis inverter coupled to said passgate and having feedback transistors of opposite conductivity, wherein a first one of said feedback transistors is tied to a positive clock signal and a second one of said feedback transistors is tied to a negative clock signal; and
   a further inverter having an input coupled to an output of said hysteresis inverter and an output coupled to an input of said hysteresis inverter, said data output coupled between said output of said hysteresis inverter and said input of said inverter.

17. The latch as recited in claim 16 wherein said further inverter is a tristate inverter.

18. The latch as recited in claim 16 wherein said feedback transistors are respectively tied to a positive supply voltage and a negative supply voltage.

19. The latch as recited in claim 16 wherein a drain of said first one of said feedback transistors is tied to a positive clock signal and a drain of said second one of said feedback transistors is tied to a negative clock signal.

20. A library of standard logic elements, comprising:
   a standard logic element corresponding to a D flip-flop having a data input and a data output and including:
      a master stage passgate coupled to said data input,
      a master stage coupled to said master stage passgate and having a hysteresis inverter with feedback transistors of opposite conductivity, wherein hysteresis in said master stage is restricted to a transparent phase of said master stage,
      a slave stage passgate coupled to said master stage, and
      a slave stage coupled between said slave stage passgate and said data output and having a hysteresis inverter with feedback transistors of opposite conductivity; and
   a standard logic element corresponding to a latch having a data input and a data output and including:
      a passgate coupled to said data input,
      a hysteresis inverter coupled to said passgate and having feedback transistors of opposite conductivity, and
      a further inverter having an input coupled to an output of said hysteresis inverter and an output coupled to an input of said hysteresis inverter, said data output coupled between said output of said hysteresis inverter and said input of said inverter.

* * * * *